United States Patent [19]

Fleming

[11] Patent Number: 5,699,103
[45] Date of Patent: Dec. 16, 1997

[54] METHOD FOR PRODUCING A CALIBRATED ARRAY OF LIGHT-EMITTING DIODES AND APPARATUS INCLUDING THE CALIBRATED ARRAY

[75] Inventor: Paul John Fleming, Lima, N.Y.

[73] Assignee: Eastman Kodak Company, Rochester, N.Y.

[21] Appl. No.: 360,156

[22] Filed: Dec. 20, 1994

[51] Int. Cl.⁶ .............................. B41J 2/45; G01R 31/27; H01L 21/66
[52] U.S. Cl. .................... 347/240; 347/236; 347/238; 324/767; 437/7; 437/8
[58] Field of Search ........................ 347/238, 236, 347/246, 133, 233, 240; 257/88; 250/552, 553; 324/767; 437/7, 8

[56] References Cited

U.S. PATENT DOCUMENTS

| | | |
|---|---|---|
| 3,850,517 | 11/1974 | Stephany et al. . |
| 4,489,477 | 12/1984 | Chik et al. ............................ 324/767 |
| 4,746,941 | 5/1988 | Pham et al. . |
| 4,799,071 | 1/1989 | Zeise et al. . |
| 4,857,944 | 8/1989 | Hart et al. ............................ 347/236 |
| 4,980,700 | 12/1990 | Ng ........................................ 347/286 X |
| 5,079,567 | 1/1992 | Beaman et al. . |
| 5,200,765 | 4/1993 | Tsi ........................................ 347/240 |
| 5,298,433 | 3/1994 | Furuyama ............................. 437/8 |
| 5,300,960 | 4/1994 | Pham et al. . |
| 5,389,953 | 2/1995 | Agar et al. ........................... 347/237 X |

FOREIGN PATENT DOCUMENTS 3421914 12/1984 Germany .

*Primary Examiner*—David F. Yockey
*Attorney, Agent, or Firm*—Norman Rushefsky

[57] ABSTRACT

A method for producing a calibrated printhead having a plurality of light-emitting recording elements such as LEDs includes the steps of (a) burning-in the recording elements until a further aging characteristic of the recording elements is in a generally linear range; (b) measuring a light intensity emitted by each recording element after the burning-in in step (a); (c) establishing a target value for additional burning-in of at least those recording elements having measured light intensities above a minimum measured light intensity for a recording element; and (d) respectively providing additional burning-in to those recording elements towards the target value. An apparatus including the calibrated printhead has no data provided to the printhead which is corrected for relative non-uniformity of the recording elements to each other.

13 Claims, 5 Drawing Sheets

METHOD FOR PRODUCING A CALIBRATED ARRAY OF LIGHT-EMITTING DIODES AND APPARATUS INCLUDING THE CALIBRATED ARRAY

BACKGROUND OF THE INVENTION

1. Field of the Invention This invention relates to the calibrating of an array of recording elements such as light-emitting diodes (LEDs).

2. Brief Description of the Prior Art

Electronic image-recording apparatus of a type comprising a line exposure array stationed in a light-exposing relationship to a photosensitive material and comprising a plurality of linearly spaced apart light-emitting diodes are known in the art. Means are generally provided for effecting a relative displacement between the light exposure array and the photosensitive material in a direction transverse to the longitudinal axis of the exposure array so as to effect an exposure of the entire surface of the photosensitive material.

One can distinguish two types of imaging using LED bars, namely bi-level imaging and grayscale imaging. In the former, each pixel of the photosensitive media experiences either maximum or zero exposure by an element of the LED bar, and the image comprises dots of maximum optical density on a background of minimum optical density. On the other hand, grayscale imaging requires that each pixel receives an exposure that is continuously variable, or variable over a number of discrete levels. The latter type of imaging is needed in areas such as high quality black and white and color reproductions and requires control of the exposure parameters with a high degree of precision.

The requirements for grayscale printing call for extremely uniform light output levels for all the LED elements on the printhead (2% for example). This result is difficult to achieve due to variations in the light output of individual LEDs within an array and variations between arrays, variability in the amount of current supplied by the individual channels of the driver integrated circuit and in particular, nonuniformity introduced by the lens system. A suggested solution to this problem to date has been to supply the printhead with correction data for each LED in the form of on-time correction or current level correction. See, for example, U.S. Pat. No. 5,300,960. This need to supply data for correction increases the complexity of the printhead interface and the cost of the printhead.

In addition, where data for uniformity correction is used typically there has been available only one or two bits for uniformity correction as part of the corrected image data. This implies that after burn-in testing of all the LEDs, all LEDs must be within a specified uniformity range of say ±15% or less from the average light output level for that printhead. If any LED on the printhead falls outside of that range, the printhead is not suited for this application and may be discarded. Another proposed method of avoiding these difficulties is described in DE 3421914 A1 and uses a photographic filter which is exposed to the non-uniform light output of the LEDs and its density is adjusted such that light output from the LED filter combination becomes uniform across the printhead. A problem with this approach is the difficulty of accurately adjusting density across the printhead so that the average LED intensity is within a suitable narrow range.

A Selfoc (trademark of Nippon Sheet Glass Limited) lens array (SLA) or gradient index fiber lens array is typically used in known printheads but presents difficulties in obtaining uniformity. This problem arises due to the fact that an SLA lens is a composite of many lens elements with some variation in element spacing, transmission efficiency is very independent on lens positioning relative to each LED. In addition, the SLA lens typically introduces non-uniformity on the order of 10%.

SUMMARY OF THE INVENTION

In accordance with the invention, an extremely uniform printhead can be achieved even if no correction data is input by taking advantage of the aging characteristics of the LEDs. LEDs typically age exponentially during the first few hours of operation and then enter a linear aging process (see FIG. 1). By first aging all the LEDs in the printhead past the exponential decay region and into the linear region, then measuring the light output for each individual LED in the lensed printhead, and differentially again aging the LEDs, one can obtain an extremely uniform printhead. The differential aging is accomplished by aging all the LEDs for different lengths of time (although aging at differing current levels or temperatures are also possibilities), the lowest intensity LED aged the least, the highest intensity LED aged the longest. Thus, for example, if the lowest intensity LED in the printhead scan is 0.3 µW/dot and another LED is at 0.35 µW/dot, if the aging rate is 0.01 µW/dot/hour, that LED would be aged for 5 hours to reduce its intensity to 0.3 µW/dot, achieving perfect uniformity between the LEDs.

DESCRIPTION OF THE PREFERRED EMBODIMENT

Because printheads of the type described herein are well known, the present description will be directed in particular to subject matter forming part of, or cooperating more directly with, the present invention.

Figure 2:
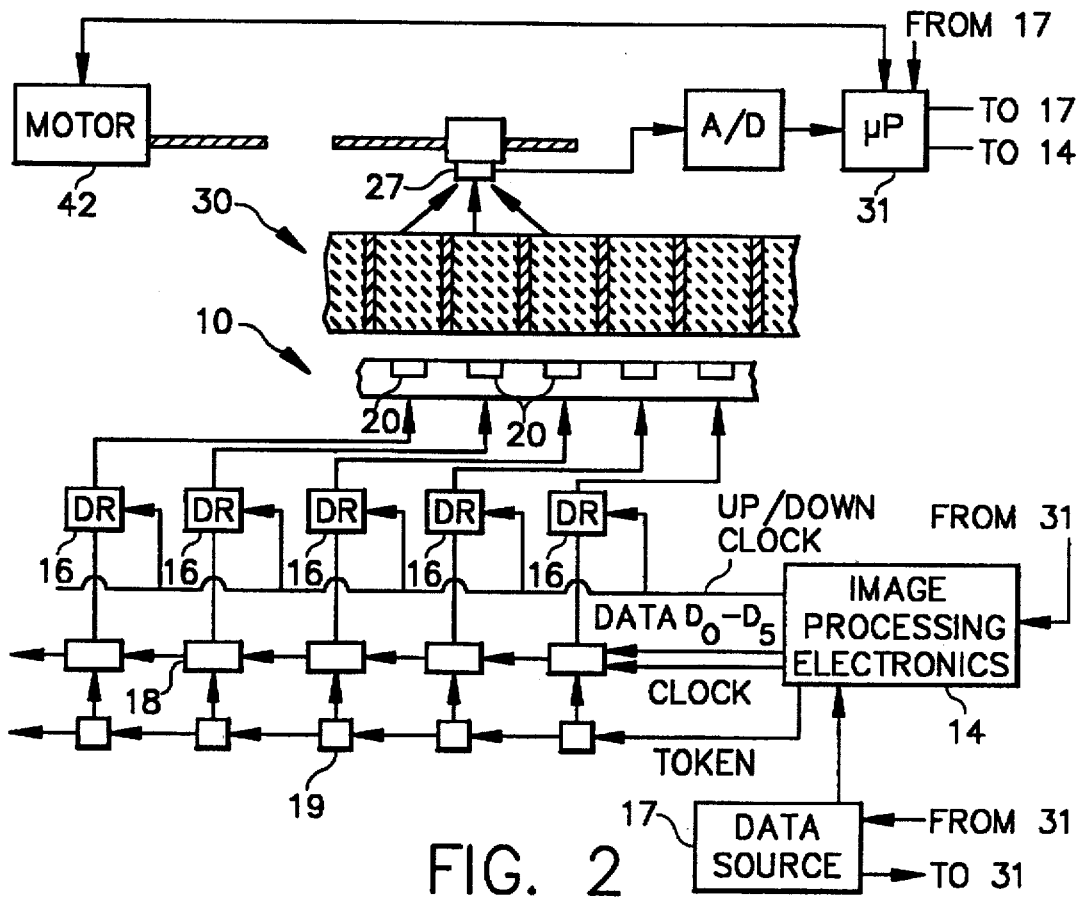
FIG. 2 is a schematic of an LED printhead and apparatus used for calibrating same.

An apparatus for use in the calibration method of the invention is typified by the diagram of FIG. 2; an LED printhead including a linear array 10 of several thousand triggerable radiation sources 20; e.g., LEDs is illustrated. The LEDs are formed on chip arrays which are in turn mounted with electronic driver chips on an appropriate support as is well known, see for example U.S. Pat. No. 5,079,567, the contents of which are incorporated herein by this reference. The LED chip arrays are positioned end to end so that a continuous row of LEDs is formed. Optical means 30 for focusing the LEDs for exposure onto a recording medium is also provided. In this regard, gradient index optical fiber devices such as Selfoc (trademark of Nippon Sheet Glass Co., Ltd.) arrays are highly suited. The LEDs of the array 10 are triggered into operation by means of image processing electronics 14 that are responsive to image signal information from a data source 17 such as a computer or scanner 17. The image processing electronics activates respective current drivers 16 and the drivers provide current to the LEDs when an image dot or pixel is to be recorded. Depending on the duration for which any given LED is turned on, the exposure effected by such LED is more or less made. Data for selecting the particular LEDs to be turned on for a particular recording line of pixels is provided in digital form, i.e., digital bits of 1's and 0's that are stored for each line in registers 18 which incorporate a data bus and latch registers for storing the data bits to allow the next line of data to be fed to the shift registers as the present line of data is being printed, see for example, U.S. Pat. No. 4,746,941, the contents of which are incorporated herein by this reference. Briefly, as noted in this patent, data lines $D_0$–$D_5$ are independent lines each carrying a signal representing a digital bit (0 or 1) so that together their respective signals define a digital six bit number from decimal 0 to decimal 63. This image data signal is passed along lines $D_0$–$D_5$ which comprises an image data signal bus. As noted above, associated with each LED is a data register means 18 for latching data from this bus during each cycle of operation for printing a single line of dots. A token bit may be used to enable a data register means associated with a particular LED to accept the data while other data register means associated with other LEDs await their respective data.

The data register means for each LED comprises a pair of latches or bi-stable multi-vibrators for each of the existing data lines. The pair of latches are connected in master-slave relationship wherein in response to a token bit signal at the enable input terminal of the master latch, an image data signal at the data input terminal of the master latch will cause the output of the master latch to either change or remain the same depending upon the image data signal. The six master latches in the data register means of each LED are commonly connected to simultaneously receive the token bit signal from the token bit shift register. In response to clock pulses from the image processing electronics 14, the token bit is passed from stage to stage of the token bit shift register and accordingly outputted sequentially for enablement of the master latches of a respective data register. With movement of the token bit from stage to stage of the token bit shift register, the data bits occurring on lines $D_0$–$D_5$ are accepted by the data registers and in turn all the data registers on one side of the printhead have acquired their respective six bits of data. A latch enable signal is then applied to cause respective slave latches to latch the data at their respective outputs. The respective outputs of the slave latches are now communicated to the data input terminals of respective comparators for determining the duration of exposure for each LED in accordance with the techniques described in U.S. Pat. No. 4,746,941. The master latches are now free to receive the image data signals for the next line of dots to be recorded.

The token bit register and data registers are incorporated in an integrated circuit driver chip which also includes the comparators, latches, and current drivers to comprise a driving circuit for a group of say 64 LEDs. An identical driver chip may be located on an opposite side of an LED array so that one of the driver chips drives the odd-numbered LEDs of an array including 128 LEDs and the other driver chip drives the even-numbered diodes of the array. An up-down counter also may be made part of each chip. As is well known, driving circuitry for each of an odd and even group of LEDs may be mounted on modules that can be independently tested before being assembled on a printhead. With assembly of the modules on the printhead, electrical interconnections are made to allow passage of the token bit and other signals between adjacent chips.

Typically, printheads of the type described herein are suited for exposure of photosensitive media. Where the recording medium is say photographic film, the latent image formed line by line by selective exposure of said LEDs may be subsequently developed by conventional means to form a visible image. Where the medium is an electrophotographic receptor, the LEDs may be used to form an electrostatic image on a uniformly electrostatically charged photoconductor and this image developed using opaque toner particles and perhaps transferred to a copy sheet, see U.S. Pat. No. 3,850,517.

As may be noted in FIG. 2, a photosensor device 27 such as a silicon photodetector, or a charge-coupled device, is positioned at the image focal plane of the gradient index lens array 30 to sense the light output from a single LED 20. This LED is enabled by a suitable signal from a microprocessor 31 to the image-processing electronics 14.

Figure 1:
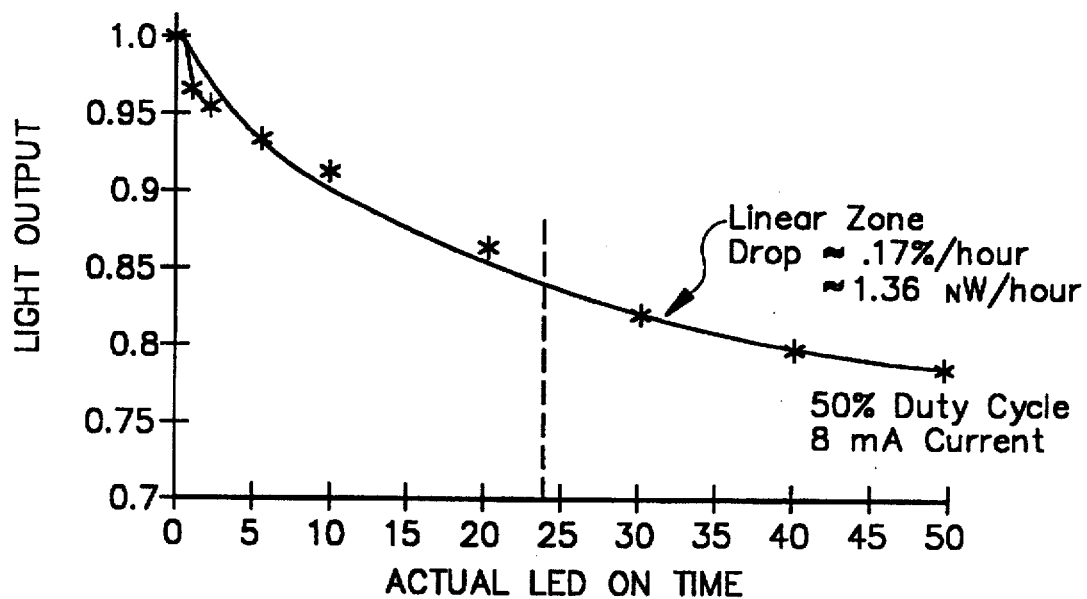
FIG. 1 is a graph illustrating a typical intensity vs. time profile during burn-in of LEDs. In this graph light output measured is normalized to time equal zero.

As may be noted from the graph of FIG. 1 during burn-in of an LED module array or entire printhead array of LEDs, the LEDs typically exhibit an initial exponential decay in intensity where the LEDs are cycled on and off for predetermined cycle periods using a predetermined current level. It is known that brighter LEDs tend to exhibit a more rapid initial decay than weaker LEDs within a group or groups of arrays of LEDs formed by similar process conditions.

By understanding the mechanisms associated with the aging process it becomes possible to tune the aging curve to minimize the amount of burn-in time required to achieve uniformity, while at the same time meeting the design parameters of light intensity drop over product life and magnitude of differential aging associated with LEDs being on for different lengths of time throughout life. A tradeoff forms between light reduction during product life and the amount of time in burn-in required to achieve uniformity.

Figure 3A:
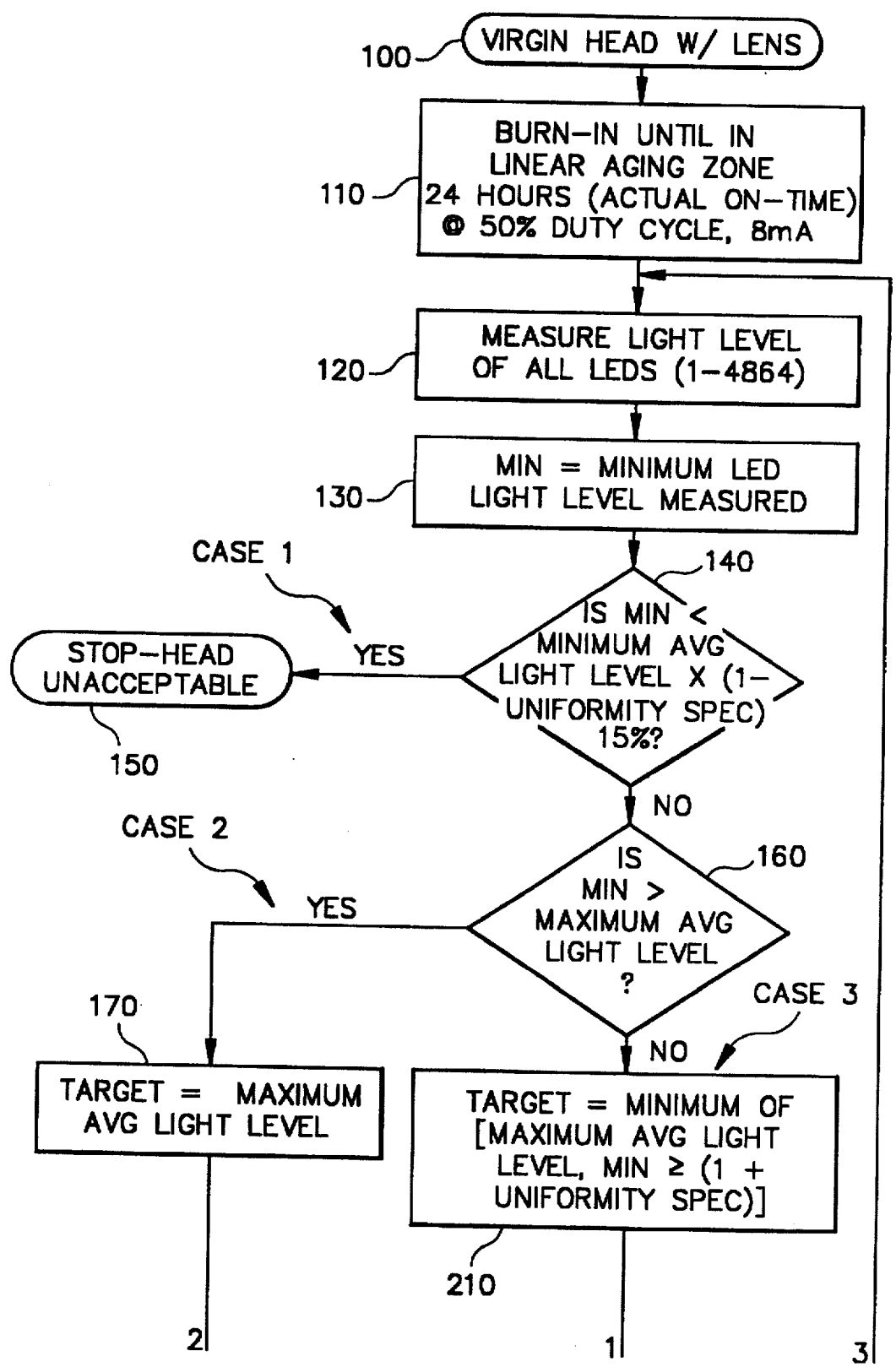
FIGS. 3A and 3B is a flowchart describing operation of the calibration method of the invention.
Figure 3B:
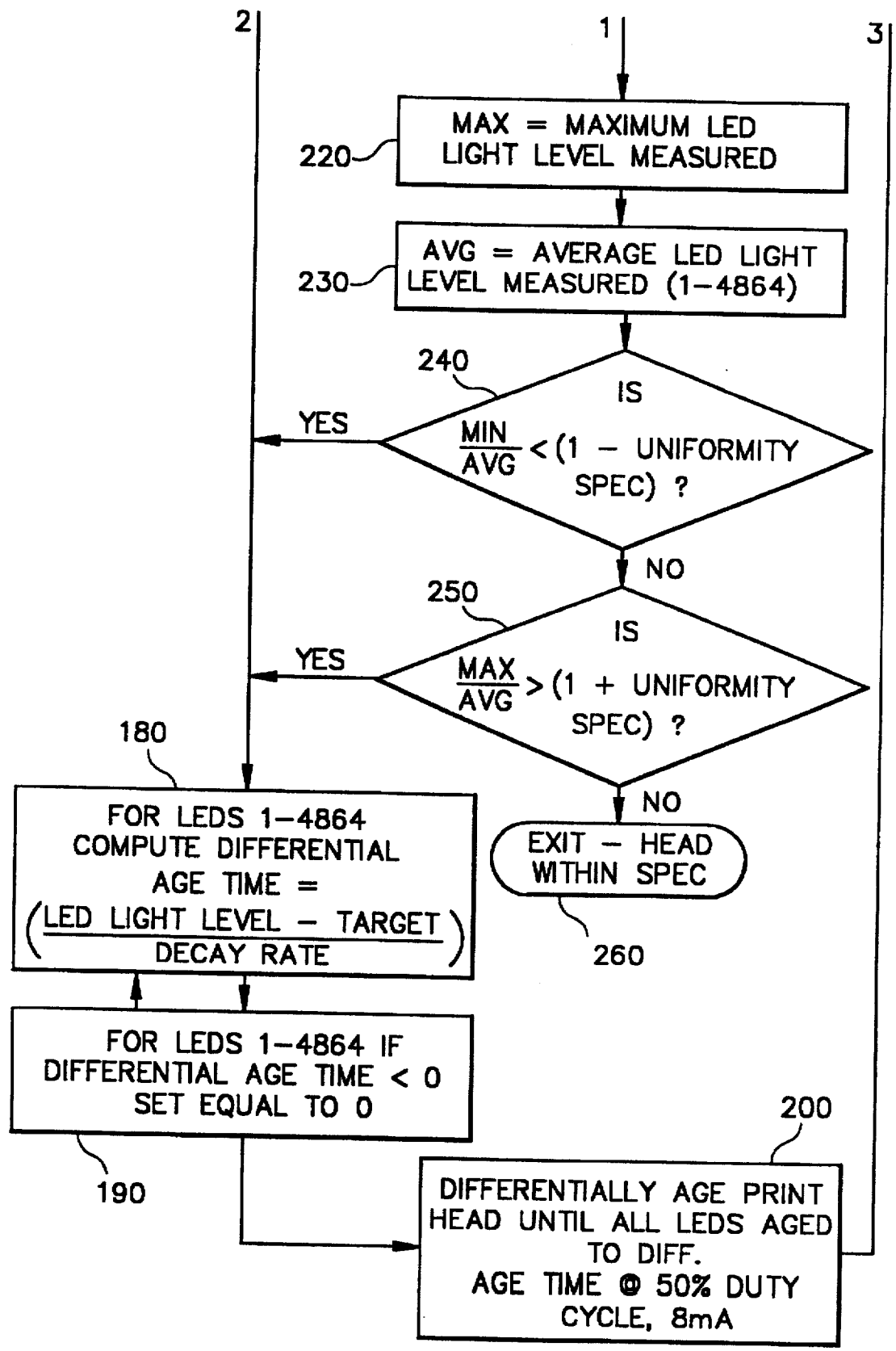
Figure 4A:
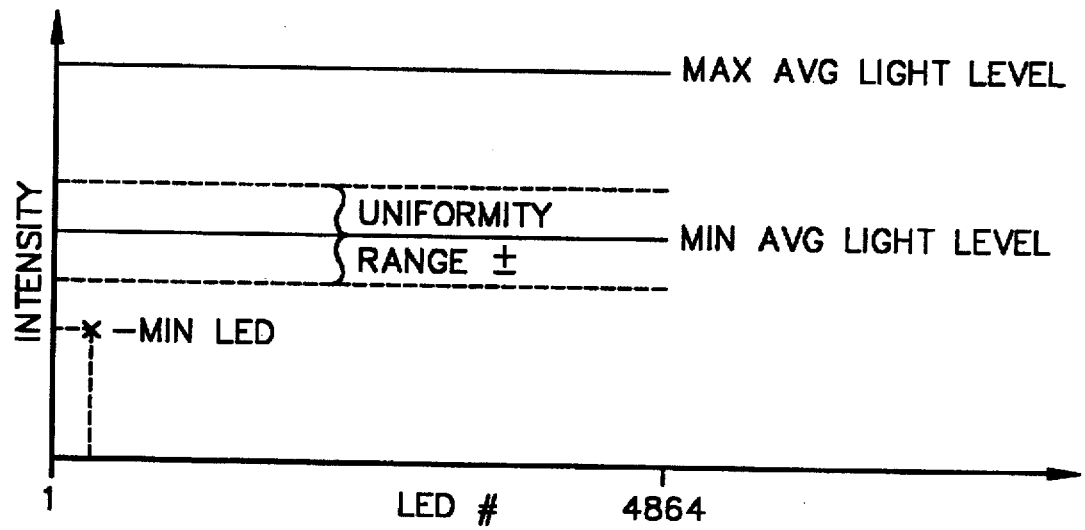
FIGS. 4A, B, C, D and E are graphs illustrating various examples in the calibration method of the invention.

With reference now to the flowchart of FIGS. 3A and 3B in step 100 a newly assembled or virgin printhead with SLA is assembled in the test fixture. In step 110, the LED printhead is subject to conventional burn-in testing for 24 hours @50% duty cycle, and 8 mA current to each LED. This test should place the decay of intensity, or aging characteristic, of all LEDs on the printhead within the linear range. At this point, conventional burn-in testing would end and the LEDs would be calibrated by measuring light outputs and determining correction data associated with the LEDs. However, in accordance with the calibration process of the invention the light intensity after lensing of each LED (assume 4864 LEDs on the printhead) is measured and stored in step 120. This step is made by sending data only to a register associated with one LED and enabling it and measuring the intensity after lensing of the light emitted by the LED. The sensor 27 is then stepped to the next location by motor 42 which is responsive to signals from the microprocessor controller 31. The light output from the LED may first be sensed to determine accurate positioning of the photosensor device 27. Outputs from the photosensor device 27 are input to an A/D converter and then to the microprocessor controller 31. In lieu of stepping a single photosensor device, a row of photosensors accurately calibrated may be positioned at the focal plane of the LEDs. In step 130, the LED or LEDs having the minimum LED light level measured are noted and the value of this minimum measured light level (MIN.) is stored. In step 140, the value MIN. is compared with a product of a specification for minimum average light level required for this printhead multiplied by one minus the desired uniformity specification which say is 15% for a printhead that will be corrected using uniformity correction bits or as low as 2% for a printhead that will not be corrected using uniformity correction bits so that if lines $D_0$–$D_5$ are to be available for carrying image data, 63 levels of gray may be realized. If MIN. is less than this product, then the printhead is unacceptable for this specification (case 1) and calibration ends, step 150. The reason for this as shown in the graph of FIG. 4A is that the process of aging the printhead would cause the average LED intensity for this printhead to be below the specified minimum average light level. Note in calibrating this printhead it is desirable that all printheads for a particular application have at least a specified minimum average light level with all LEDs on a printhead being within a specified range from the LED with minimum light output.

Figure 4B:
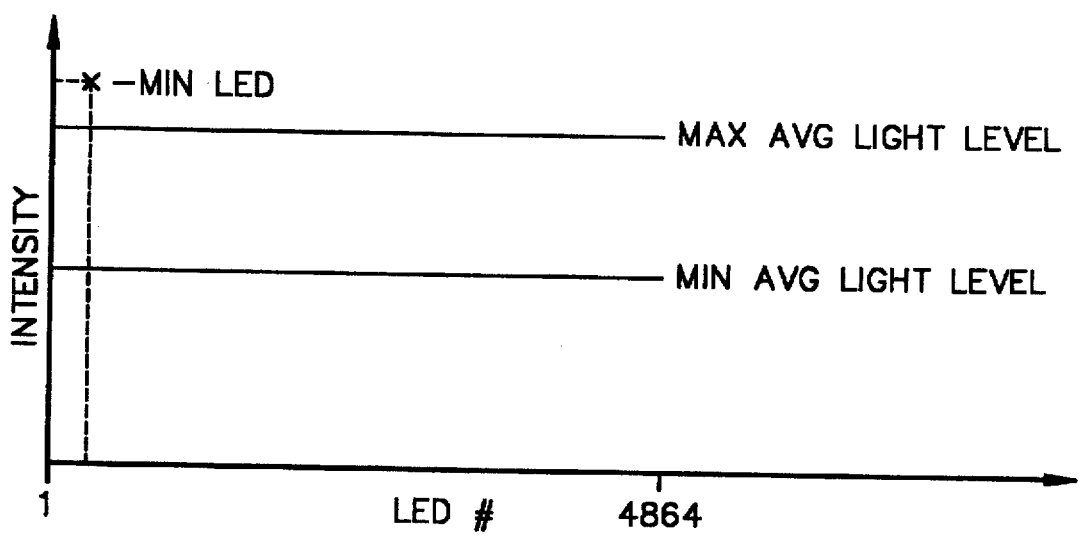

In the event that MIN. is not less than the minimum average light level specified multiplied by one minus the uniformity specification then the process proceeds to step 160 wherein a determination is made as to whether or not MIN. is greater than the maximum average light level (see FIG. 4B). Assuming the answer is yes, it is an instance of case 2 and the process proceeds to step 170 wherein a target for burn-in is defined as the maximum average light level specified. In step 180 for each of the 4864 LEDs, there is computed a differential age time according to the relationship LED light level minus target light level, divided by the decay rate or drop, which is constant in accordance with the LED aging characteristic being in the linear range (see FIG. 1). Alternatively if the decay rate is expressed as a percent drop per time unit (%/hour) then the differential age time is computed according to the relationship LED light level minus target light level, divided by the product of target light level times decay rate. In step 190, if any LEDs have a differential age time less than zero, then the additional burn-in time is set to zero. In step 200, the LEDs are differentially aged according to the respective calculations made in step 180 using a 50% duty cycle at a current to each of 8 mA. The calibration process now loops back to step 120 wherein the light intensities of each of the LEDs is measured again. After this second measurement, assume the case 3 situation arises either from the initial measurement or the remeasurement from case 2. In case 3, and with reference to FIG. 4D, assume further that the MIN. is determined to be less than or equal to the maximum average light level specified but greater than or equal to the minimum average light level. For case 3, the target is set to the minimum of the maximum average light level or the product of the MIN. multiplied by one plus the uniformity specification (step 210).

Step 220 notes that the maximum LED light level that was measured in step 120 was stored in memory and flagged as "MAX." Step 230 notes that from the measurement of LED light level or intensity measured in step 120 that an average was taken of these measurements and identified as "AVG." In step 240, a determination is made as to whether or not MIN. divided by AVG. is less than one minus the uniformity specification. If the answer is yes, obviously some LEDs including that at light level MIN. are outside of the desired range for all LEDs on that printhead and further burn-in is needed using the target determined in 210. If the answer is no, then the process proceeds to step 250 wherein a determination is made as to whether or not MAX. divided by AVG. is greater than one plus the uniformity specification. If the answer is yes, obviously some LEDs including MAX. are outside of the desired range for all LEDs on that printhead and further burn-in testing is needed using the target determined in step 210.

If the answer in step 250 is no, it implies that MIN. is within the range defined by one minus the uniformity specification and MAX. is within the range defined by one plus the uniformity specification, thus all LEDs on the printhead are within a desired plus-minus uniformity range of the average for this printhead. Futhermore, the calibration process thereby ensures that the average of the light intensities of the LEDs for this printhead will be between the minimum average light level specified and the maximum average light level specified.

Figure 4C:
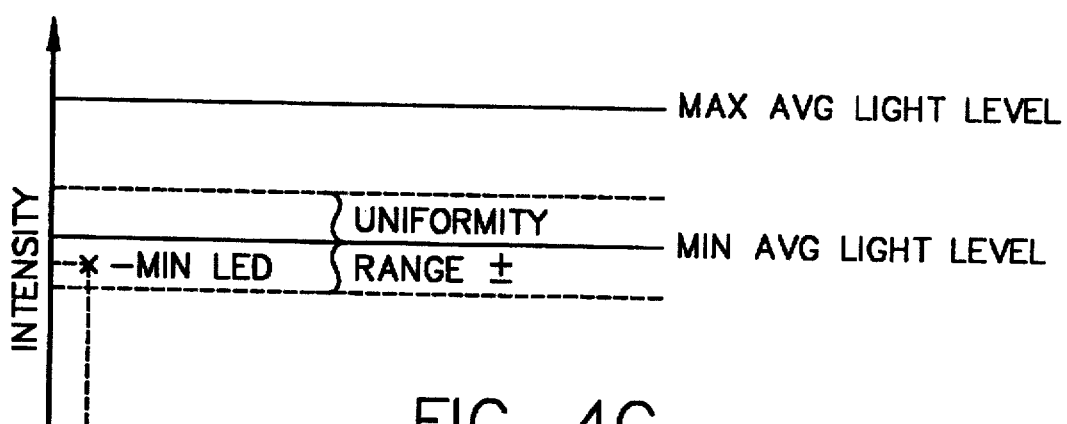
Figure 4D:
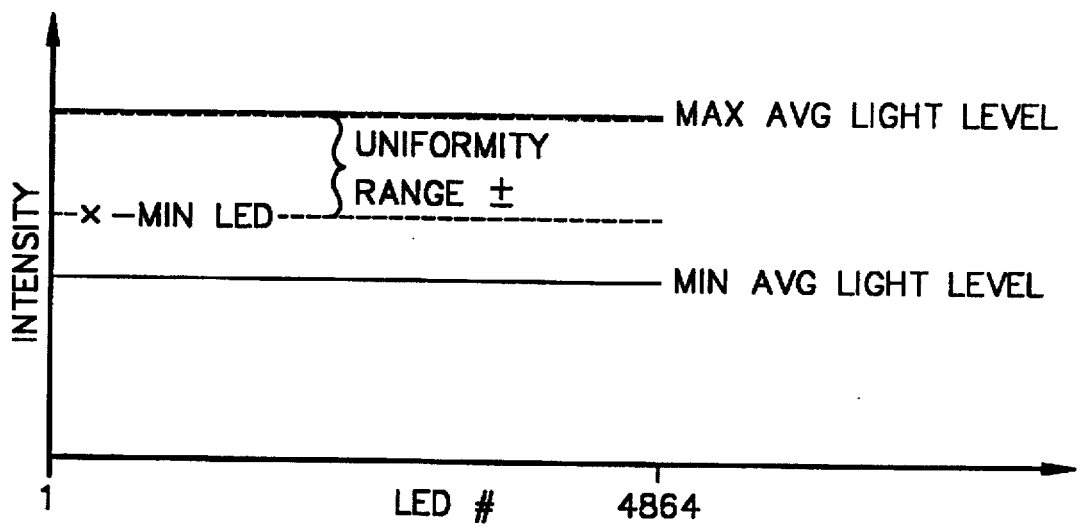
Figure 4E:
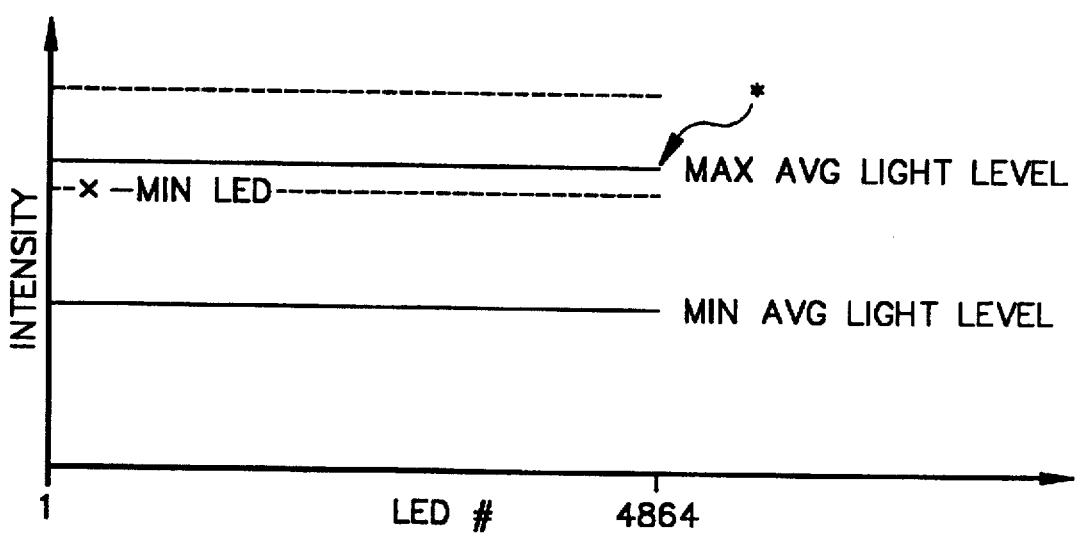

As may be seen in FIG. 4C, D, and E, case 3 is illustrated with three examples. In the example shown in FIG. 4C where MIN. is below the specified minimum average light level, the target value for burning-in is set to MIN. multiplied by one plus the uniformity specification. This serves to bring the average down just far enough to get the MIN. LED into the uniformity requirement. In the example of FIG. 4D wherein MIN. falls between the specified minimum average light level and the specified maximum average light level, the target value is also set to MIN. multiplied by one plus the uniformity specification. This will also bring the average down just far enough to get the MIN. LED into the uniformity requirement. In the example of FIG. 4E, where MIN. is just below the maximum average light level so that the uniformity range allowed from the average for this printhead will allow some LEDs to be above the maximum average light level, the target value is set to maximum average light level. This will bring the average down to the maximum average light level meeting both of the requirements that the average intensity for this printhead be no greater than the maximum average light level and all the LEDs on the printhead are within a specified range from their average intensity.

This approach to the uniformity problem offers the advantages of reduced complexity and cost in the printhead interface. There are no extra components needed in the printhead or manufacturing process therefor to achieve this as there is with the photographic coating approach. Aging is already a part of the standard manufacturing process (to burn-in past the exponential decay zone), its duration is merely increased. After aging to uniformity the LEDs age at close to the same rate since they are all in the linear portion of the aging curve, providing good stability in uniformity over the operating life of the printhead.

If desired, calibration in the LED may be maintained during printing use by keeping track of those LEDs that are being under-utilized. During periods of non-printing activity such as during warm-up or shutdown, the under-utilized LEDs may be turned on to cause them to age uniformly with those LEDs having greater use; see for example U.S. Pat. No. 4,799,071.

While the invention will find particular utility with reference to gray level printheads the calibration method of the invention is also useful for binary printheads. The invention is not limited to LEDs but is also applicable to other recording elements that may be calibrated with the method claimed.

With the method described herein the use of one or two bits to correct for nonuniformities, in LEDs on a printhead may become unnecessary. The data line for these two extra bits may be either eliminated from the printhead or used for defining additional gray levels. Thus a 4 bit gray level printhead having 2 extra bits of correction may handle 6 bits of gray level data. Using differential burning-in testing to obtain a specified ±2% uniformity is not possible without use of other correction schemes since an SLA typically has non-uniformity on the order of −3% to +6%.

The invention has been described in detail with particular reference to preferred embodiments thereof, but it will be understood that variations and modifications can be effected within the spirit and scope of the invention.

I claim:

1. A method for producing a printhead having a plurality of light-emitting recording elements, the recording elements exhibiting an aging characteristic, the printhead being calibrated to have reduced nonuniformities in respective light outputs between recording elements on the printhead, the method comprising the steps of:

(a) burning-in all the recording elements until the aging characteristic of the recording elements is in a linear range of an aging curve;

(b) measuring a light intensity emitted by each of the recording elements after said burning-in in step (a), at least some of the recording elements having measured light intensities above a minimum measured light intensity for one of said recording elements;

(c) establishing a target value of light intensity for additional burning-in of at least some of the recording elements each having a respective measured light intensity above said minimum measured light intensity; and (d) respectively differentially aging said at least some of the recording elements by providing additional burning-in to said at least some of the recording elements towards said target value.

2. The method of claim 1 and wherein the target value is a specified maximum average light level for the printhead wherein the minimum measured light intensity is greater than a specified maximum average light level for the printhead.

3. The method of claim 1 and wherein the target value is the lesser of (i) a specified maximum average light level of the printhead and (ii) MIN.×(1+a uniformity specification factor), wherein the uniformity specification factor relates to a range of intensities that all recording elements on one printhead are required to be within and MIN. is said minimum measured light intensity.

4. The method of claim 1 and wherein in step (d) said at least some of the recording elements are subjected to said additional burning-in according to the following relationship: (the respective measured recording element light intensity—the target value)÷(a decay rate of the aging characteristic of the recording elements in the linear range).

5. The method of claim 2 and wherein in step (d) said at least some of the recording elements are subjected to said additional burning-in according to the following relationship: (the respective measured recording element light intensity—the target value)÷(a decay rate of the aging characteristic of the recording elements in the linear range).

6. The method of claim 3 and wherein in step (d) said at least some of the recording elements are subjected to said additional burning-in according to the following relationship: (the respective measured recording element light intensity—the target value)÷(a decay rate of the aging characteristic of the recording elements in the linear range).

7. The method of claim 1 and wherein in step (b) the measuring is of light after passing through a lens.

8. An image-recording apparatus comprising a printhead produced in accordance with the method of claim 7 and plural image data lines being connected between the printhead and processing electronics, said processing electronics providing grey level definition data for said recording elements on all said image data lines and providing no image data which is corrected for relative non-uniformity of the recording elements to each other.

9. The apparatus of claim 8 and wherein all the recording elements are LEDs.

10. The method of claim 2 and wherein in step (b) the measuring is of light after passing through a lens.

11. The method of claim 3 and wherein in step (b) the measuring is of light after passing through a lens.

12. The method of claim 4 and wherein in step (b) the measuring is of light after passing through a lens.

13. The apparatus of claim 9 and wherein there is no selective filtering of light from the LEDs to obtain reduced nonuniformities in respective light outputs between recording elements.

* * * * *